(12) United States Patent
Hirano (10) Patent No.: US 7,857,983 B2
(45) Date of Patent: Dec. 28, 2010

(54) METHOD FOR MANUFACTURING PIEZOELECTRIC RESONATOR

(75) Inventor: Keisuke Hirano, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 645 days.

(21) Appl. No.: 11/881,032

(22) Filed: Jul. 24, 2007

(65) Prior Publication Data
US 2008/0023437 A1 Jan. 31, 2008

(30) Foreign Application Priority Data
Jul. 27, 2006 (JP) ............... 2006-204199

(51) Int. Cl.
*H01B 13/00* (2006.01)
*C03C 15/00* (2006.01)
*H01L 41/22* (2006.01)
(52) U.S. Cl. ............... 216/13; 216/83; 29/25.35
(58) Field of Classification Search ........... 204/192.18; 29/25.35; 310/320; 331/73
See application file for complete search history.

(56) References Cited
U.S. PATENT DOCUMENTS
2005/0116586 A1* 6/2005 Tanaya et al. ............ 310/348

2006/0082261 A1* 4/2006 Tanaya ................ 310/370

FOREIGN PATENT DOCUMENTS
| JP | 6-113704 | 4/1994 |
|---|---|---|
| JP | 2002-76806 | 3/2002 |
| JP | 2006-108824 | 4/2006 |

* cited by examiner

*Primary Examiner*—Binh X Tran
*Assistant Examiner*—Patti Lin
(74) *Attorney, Agent, or Firm*—Jordan and Hamburg LLP (57) ABSTRACT

To provide a method for manufacturing a piezoelectric resonator which can widen the range of frequency adjustment while saving metal thereby suppressing reduction of the yields when forming a metal film for frequency adjustment at the tip of an vibrating arm. The method of manufacturing the piezoelectric resonator according to the present invention includes the steps of: bringing a substrate in which an outside shape of a piezoelectric oscillating piece is formed, into contact with an etching solution; forming grooves in a plurality of vibrating arms using a mask having an aperture at the portion corresponding to the groove, and having a metal film formed on the whole surface except the aperture; and thereafter, forming a resist mask on the surface of the substrate so that resist is left at the tip of the vibrating arms which will be a formation area of a metal film for frequency adjustment so as to remove the metal film by etching. Then, forming an electrode film after peeling off the resist film left at the tip of the vibrating arm.

6 Claims, 12 Drawing Sheets

METHOD FOR MANUFACTURING PIEZOELECTRIC RESONATOR

BACKGROUND OF THE INVENTION

1. Field of the Invention

The present invention relates to a technology for manufacturing, for instance, a tuning fork type piezoelectric resonator using a piezoelectric substrate made of, for instance, quartz crystal or the like.

2. Description of the Related Art

The tuning fork type quartz resonator has long been adopted as a signal source for pacing of a wrist watch owing to its compactness, inexpensiveness and low power consumption, and the uses thereof are still expanding. The CI (crystal impedance) value of this quartz resonator is required to be as small as possible for the purpose of reducing the power loss, and therefore a quartz resonator of which oscillation efficiency is enhanced by forming a groove therein has been used for this purpose.

Figure 9:
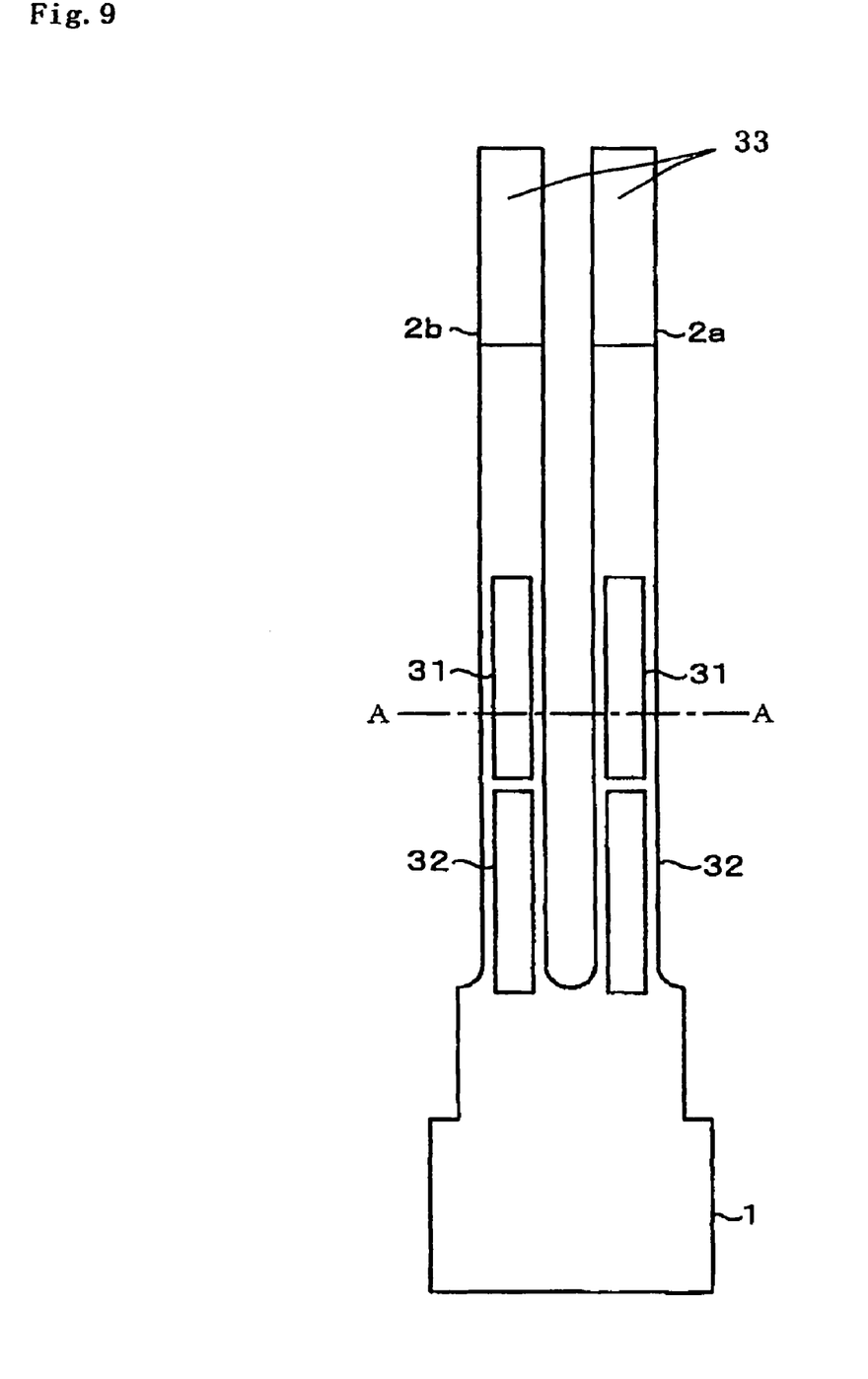
FIG. 9 is a schematic plan view showing an example of the tuning fork type quartz resonators.

As shown in FIG. 9, the quartz resonator is provided with a pair of vibrating arms 2a and 2b in a base 1, and the grooves 31 and 32 are respectively arranged on both main surfaces of the respective vibrating arms 2a and 2b. Excitation electrodes (not shown) for exciting tuning fork vibration based on bending vibration are formed in these grooves 31, 32 and the respective vibrating arms 2a, 2b.

Figure 10A:
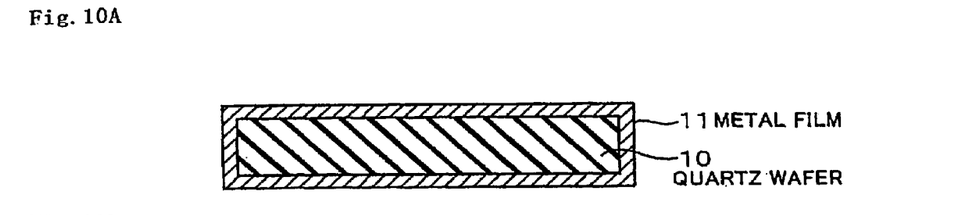
FIGS. 10A to 10E are schematic cross sectional views showing a method for manufacturing a conventional tuning fork type quartz resonator.
Figure 10B:
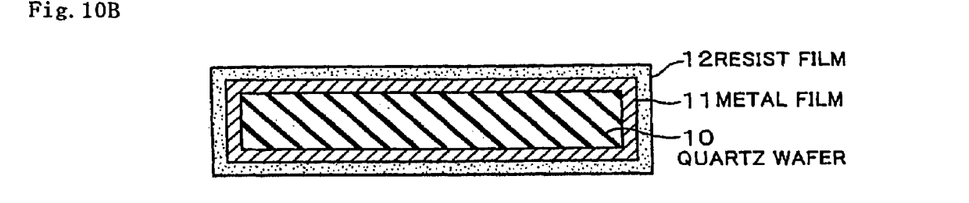

The above-described quartz resonator is manufactured according to the following process (refer to Patent Document 1). FIGS. 10A to 10E and FIGS. 11F to 11I are views showing the manufacturing processes of the cross sectional portion along A-A line in FIG. 9. First, after polishing and cleaning a cutout quartz wafer 10, a metal film 11 is formed by a sputtering method (FIG. 10A). A film in which gold (Au) is stacked on a backing film of, for instance, chromium (Cr) is used as the metal film 11.

Figure 10C:
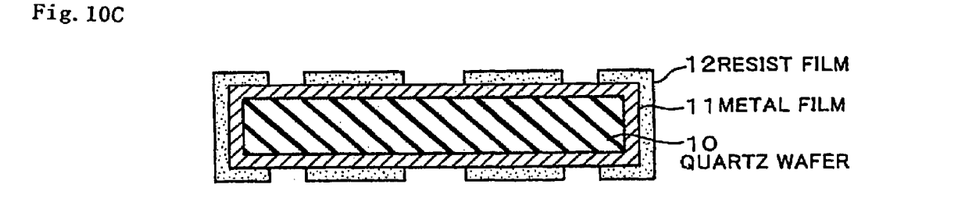
Figure 10D:
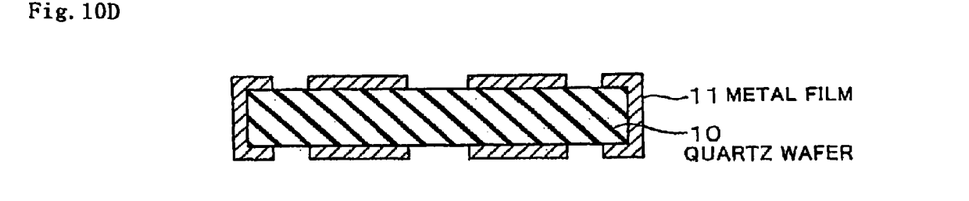

Then, after applying a photoresist on such a metal film 11 by a spray method for instance (FIG. 10B), the photoresist is exposed and developed in a manner to obtain a pattern having the shape of the quartz piece, namely, a tuning fork shape pattern, so that a tuning fork shaped resist film 12 is formed (FIG. 10C). Thereafter, the portion of the metal film 11 not covered with the resist film 12 is removed by etching using, for instance, a potassium iodide (KI) solution, and the whole resist film 12 remaining on the quartz wafer 10 is removed (FIG. 10D).

Figure 10E:
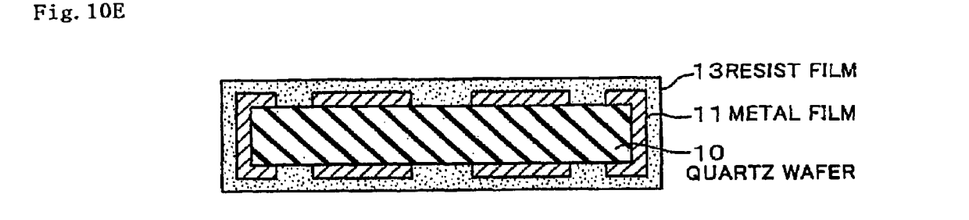
Figure 11F:
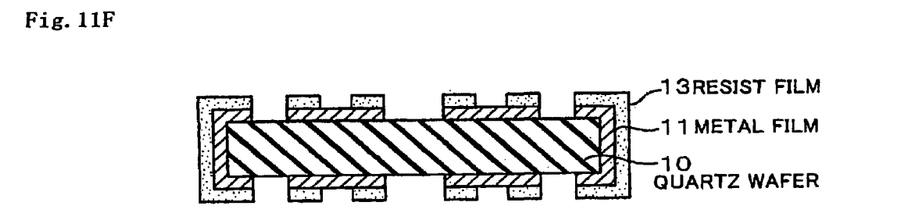
FIGS. 11F to 11I are schematic cross sectional views showing the method for manufacturing the conventional tuning fork type quartz resonator.
Figure 11G:
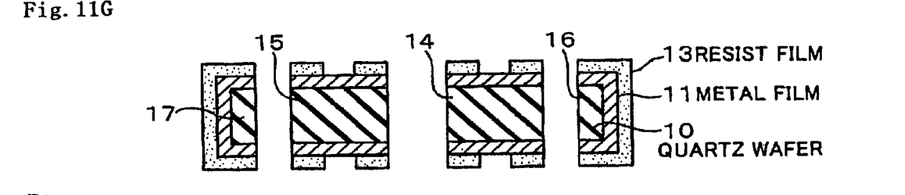

Next, the photoresist is applied to the whole surface of the quartz wafer 10 by, for instance, a spray method, and a resist film 13 is formed (FIG. 10E). Then, a resist pattern is formed by lithography so that the outside shape of the quartz piece is preserved, and the portions corresponding to the grooves 31 and 32 shown in FIG. 9 are opened (FIG. 11F).

Figure 11H:
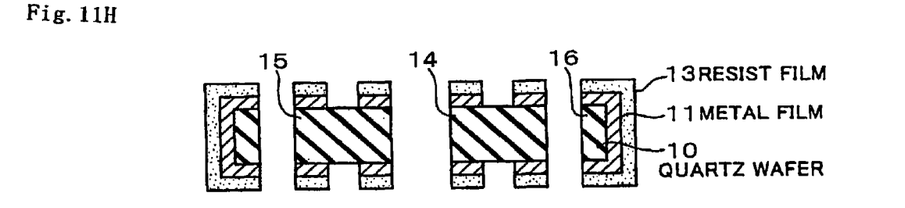
Figure 11I:
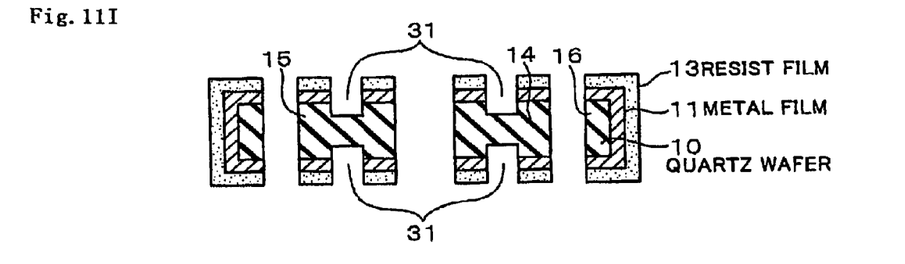

Thereafter, while the resist film 13 is kept on the metal film 11, wet etching is conducted by immersing the quartz wafer 10 into hydrofluoric acid which is an etching solution using the metal film 11 as a mask to form the outside shape of the quartz piece (FIG. 11G). 14 and 15 in FIGS. 11F to 11I are portions corresponding to the vibrating arms 2a and 2b, and 16, 17 in FIGS. 11F to 11I are outer frame portions described for convenience sake of taking out a sheet of quartz piece from the quartz wafer. Then, the metal film 11 at the portions corresponding to the grooves 31 and 32 shown in FIG. 9 is removed by etching in a potassium iodide (KI) solution using the resist film 13 as a mask (FIG. 11H). Then, wet etching is performed by immersing the quartz wafer 10 into hydrofluoric acid. By these processes, the grooves 31 and 32 are formed on both main surfaces of the quartz piece 10 (FIG. 11I).

Figure 12J:
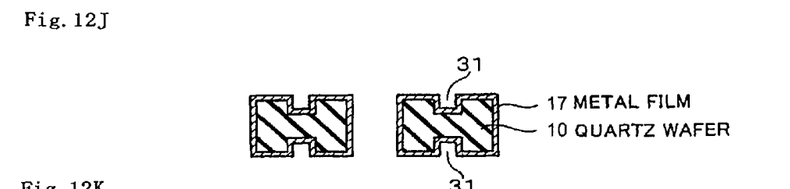
FIGS. 12J to 12N are schematic cross sectional views showing the method for manufacturing the conventional tuning fork type quartz resonator.

Then, after removing all of the resist film 13 and the metal film 11 remaining on the surface of the quartz wafer 10, an electrode pattern is formed on the surface of the quartz wafer 10. The process of forming the electrode pattern will be explained as follows. First a metal film 17 to be an electrode is formed on both surfaces of the quartz wafer 10 by sputtering method (FIG. 12J). A film in which gold (Au) is stacked on a backing film of, for instance, chromium (Cr) is used as the metal film 11.

Figure 12K:
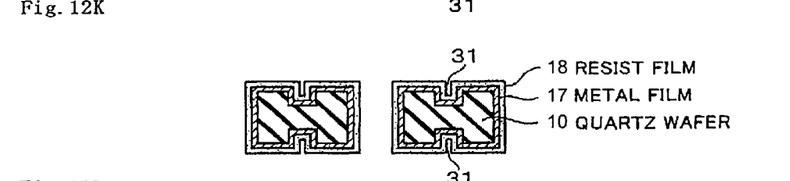
Figure 12L:
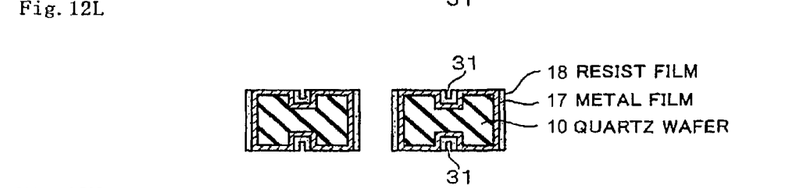
Figure 12M:
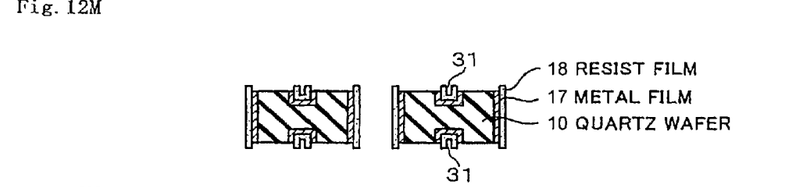
Figure 12N:
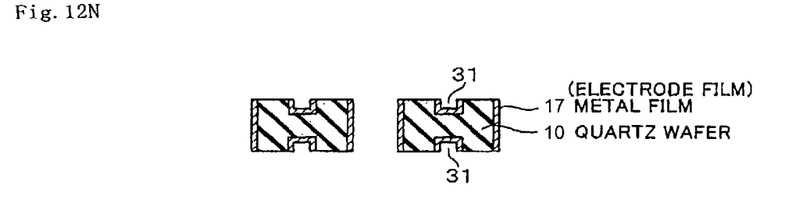

Next, the photoresist is applied to such a metal film 17 by the spray method (FIG. 12K). A resist film 18 excepting the resist film 18 that will be an electrode pattern is removed by a photolithography method (FIG. 12L). Thereafter, an electrode pattern is formed by etching the metal film 17 at the portion where the resist film 18 has been removed (FIG. 12M). Then, all of the resist film 18 remaining on the quartz wafer 10 is removed (FIG. 12N). Thus, excitation electrodes are formed in the grooves 31 and 32, and the respective vibrating arms 2a and 2B.

At the tip portions of the excitation arms 2a and 2b (areas shown by 33 in FIG. 9), the surfaces of the metal film (excitation electrode) 17 formed on the tips are shaved by laser or the like so as to adjust oscillation frequency by adjusting the thickness thereof.

There are however the following disadvantages in the process of adjusting the oscillation frequency. In a process shown in FIG. 12J, the film thickness of the metal film 17 formed on the surface of the quartz wafer 10 is very thin, being, for instance, 0.1 □m in thickness. Therefore, when the metal film 17 is used as it is for an adjustment film to adjust the oscillation frequency, it has the disadvantage of reduction in yield due to extreme narrowness of the allowable adjustment range in frequency.

As a countermeasure for this disadvantage, it is conceivable to make the thickness of the metal film 17 great in the process shown in FIG. 12J. However, it needs increased amount of metal to be used, and especially when gold (Au) is used as the metal, it has the disadvantage of increase in cost.

Furthermore, in Patent Document 2, it is described that following to the process of forming a metal film having the shape corresponding to the outside shape of the piezoelectric oscillating piece, a resist mask having an aperture only on the tip of the piezoelectric oscillating piece is formed, and a metal film made of gold (Au) for frequency adjustment is formed on the metal film by the field plating method in a manner to expose to the aperture. This requires a new specific process for forming a metal film for frequency adjustment, after forming the aperture on the resist mask, which result in an increase in the number of the total processes, and thus bringing a disadvantage of making the manufacturing process intricate.

In Patent Document 3, it is described that an electrode material and a photoresist are formed on the surface of a quartz plate in this order, and after etching the electrode material using an exposed resist film as a mask, the quartz plate is etched using this electrode material as a mask, and this electrode material is used as an excitation electrode, leaving the electrode material on the surface of the quartz plate. However, there is no description of the film for frequency adjustment.

[Patent Document 1]

Japanese Patent Application Laid-open No. 2002-76806 (columns 0094 to 0113, FIGS. 9 to 13)

[Patent Document 2]

Japanese Patent Application Laid-open No. 2006-108824 (columns 0036 to 0037, FIG. 4)

[Patent Document 3]

Japanese Patent Application Laid-open No. Sho. 61-13704 (FIG. 2)

SUMMARY OF THE INVENTION

The present invention is achieved in consideration of such circumstances and its object is to provide a method for manufacturing a piezoelectric resonator which can widen the allowable range of adjustment while reducing the amount of metal to be used when forming a metal film for frequency adjustment at the tip of an vibrating arm, and thereby preventing the yield from reduction.

In a method for manufacturing a plurality of piezoelectric oscillating piece including a base, a plurality of vibrating arms extending from the base, and grooves formed in these respective vibrating arms by etching a piezoelectric substrate, the present invention includes the steps of:

obtaining a piezoelectric oscillating piece which has an outside shape portion and grooves and the portion excepting the above-described grooves are covered with a metal film;

forming a resist mask on the surface of the above-described piezoelectric substrate so that the tip portion of the above-described vibrating arm which will be a formation area of the metal film for frequency adjustment is covered and other portions are exposed, and removing the exposed metal film;

removing the above-described resist mask and forming a metal film to form an electrode on the whole surface of the outside shape portion of the piezoelectric oscillating piece;

forming a new resist mask on the surface of the above-described metal film to etch the metal film so as to form an electrode pattern; and removing the above-described new resist mask and adjusting the oscillation frequency by shaving the metal film for frequency adjustment formed at the tip of the above-described vibrating arm so as to adjust the thickness thereof.

In the above-described manufacturing method, the thickness before adjusting the thickness of the metal film for frequency adjustment formed at the tip of the above-described vibrating arm is preferably, for instance, 0.3 to 0.5 µm, and the thickness of the electrode pattern except the metal film for frequency adjustment is preferably, for instance, 0.1 to 0.2 µm.

In another method for manufacturing a plurality of piezoelectric oscillating piece including a base, a plurality of vibrating arms extending from the base, and grooves formed in these respective vibrating arms by etching a piezoelectric substrate, the present invention includes the steps of:

forming a metal film on both surfaces of the above-described piezoelectric substrate;

forming a first resist mask having a pattern corresponding to the outside shape portion of the piezoelectric oscillating piece on the above-described metal film and etching the above-described metal film to expose the surface of the piezoelectric substrate; then, etching the exposed portion of the piezoelectric substrate and thus manufacturing the outside shape portion of the piezoelectric oscillating piece;

removing the above-described first resist mask and forming a second resist mask having an aperture at a portion corresponding to the above-described groove;

etching the above-described metal film using the second resist mask to expose the surface of the piezoelectric substrate;

then, etching the exposed portion of the piezoelectric substrate and thus forming the groove;

removing the above-described second resist mask and forming a third resist mask on the surface of the above-described piezoelectric substrate so that the tip of the above-described vibrating arm which will be a formation area of the metal film for frequency adjustment is covered and other portions are exposed and removing the exposed metal film;

removing the above-described third resist mask and forming a metal film for forming an electrode on the surface of the outside shape portion of the piezoelectric oscillating piece;

forming a fourth resist mask on the surface of the above-described metal film and etching the metal film, thereby forming an electrode pattern; and removing the above-described fourth resist mask and adjusting the oscillation frequency by shaving the metal film for frequency adjustment formed at the tip of the above-described vibrating arm so as to adjust the thickness thereof.

In the above-described manufacturing method, the thickness before adjusting the thickness of the metal film for frequency adjustment formed at the tip of the above-described vibrating arm is preferably, for instance, 0.3 to 0.5 µm, and the thickness of the electrode pattern except the metal film for frequency adjustment is preferably, for instance, 0.1 to 0.2 µm.

According to the present invention, the metal film used at the time of forming the outside shape portion and the groove of the piezoelectric oscillating piece is preserved at the tip of the vibrating arm and thereafter, a metal film to be an electrode is newly formed on the surface of the substrate. Accordingly, the film thickness of the metal film formed at the tip of the oscillating is increased, and as a result, a margin of the frequency adjustment is widened. As a result, it is possible to prevent the yield from reduction and to reduce the amount of metal which will be used to form an electrode in the next electrode pattern formation process. Therefore, especially when gold (Au) is used as the metal, the effect of saving metal is great because gold is very expensive.

DETAILED DESCRIPTION OF THE PREFERRED EMBODIMENT(S)

A method for manufacturing a tuning fork type quartz resonator which is a piezoelectric resonator will be explained as an embodiment of the present invention. Since the structure of the quartz resonator relating to the present embodiment is the same as that of the quartz resonator explained in the article of Related Art with reference to FIG. 9, explanation of the same portions will be omitted.

Figure 1:
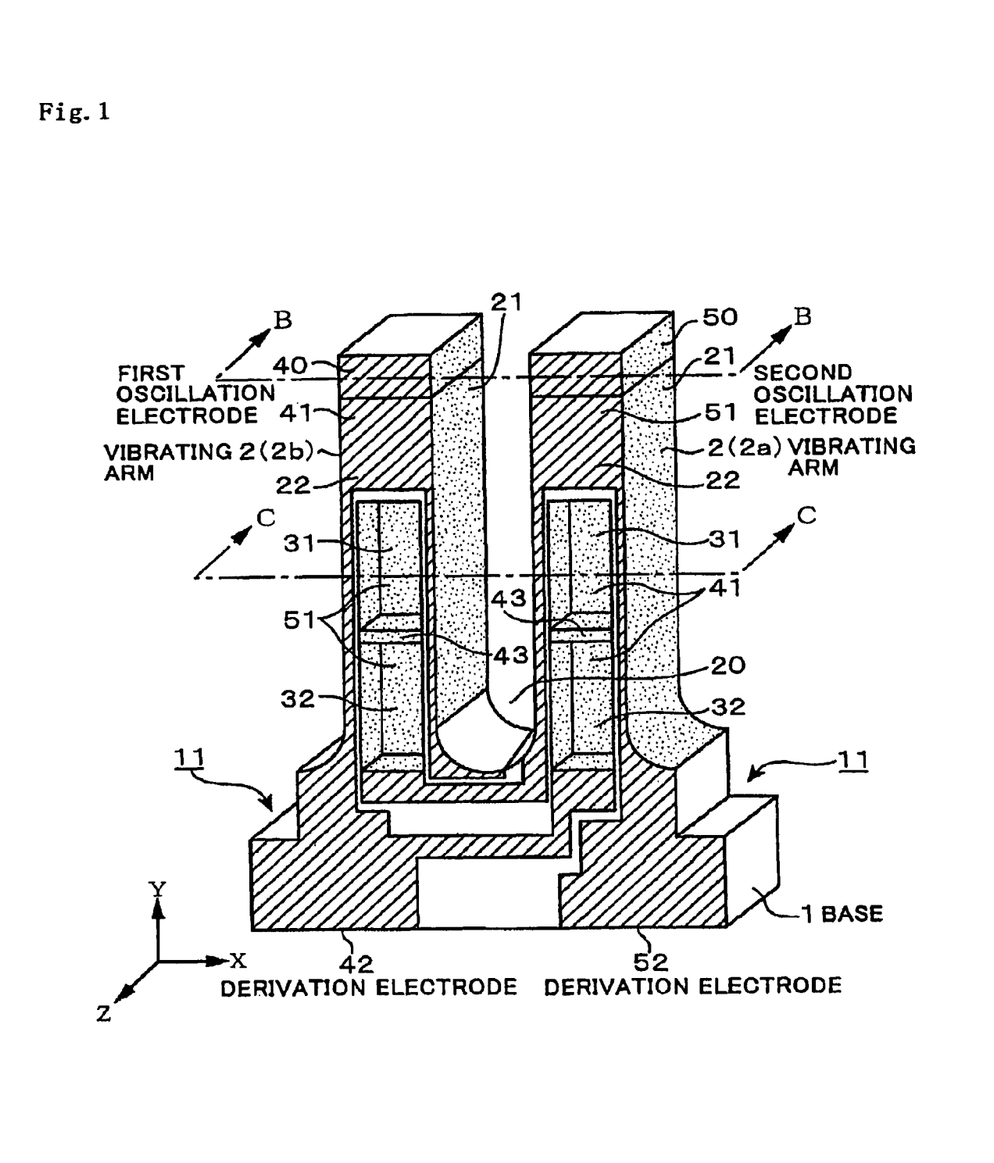
FIG. 1 is a perspective view showing an example of a tuning fork type quartz resonator relating to an embodiment of the present invention.

As shown in FIG. 1, a first excitation electrode 41 is formed on the whole inner surfaces of a plurality of grooves 31 and 32 aligned in the longitudinal direction of an vibrating arm 2a, for instance, a first groove 31 and a second groove 32, and between these grooves 31 and 32 on the vibrating arm 2a out of the vibrating arms 2. That is, by the excitation electrode 41 formed on a so-called bridge portion 43 corresponding to a portion between the first groove 31 and the second groove 32, the excitation electrodes 41 within the respective grooves 31 and 32 of the vibrating arm 2a are connected to each other. The second excitation electrode 51 is formed on both side surfaces 21, 21 of the vibrating arm 2a and the tip portions of the main surfaces 22, 22 (the front side and the back side). Furthermore, on the tip portion of the vibrating arm 2a, an adjusting weight 50 which is a metal film for adjusting the oscillation frequency by adjusting the weight is installed. The adjusting weight 50 is a part of the excitation electrode 51, but the film thickness and materials for the electrode etc. are different from electrodes on other portions. It should be noted that the excitation electrodes 41 and 51 in FIG. 1 are expressed using slant lines and black dots to make the drawing of both electrodes easier to be recognized. Accordingly, the slant lines in FIG. 1 are not for showing a cross section of the quartz piece.

A second excitation electrode 51 is formed on the whole inner surfaces of a plurality of grooves aligned in the longitudinal direction of an vibrating arm 2b, for instance, a first groove 31 and a second groove 32, and between each of these grooves 31 and 32 on the vibrating arm 2b out of the vibrating arms 2. The first excitation electrode 41 is formed on both side surfaces 21, 21 of the vibrating arm 2b and the tip portions of the main surfaces 22, 22 (the front side and the back side). It should be noted that even on the tip portion of the vibrating arm 2b, an adjusting weight 40 for adjusting the oscillation frequency by adjusting the weight is installed in the similar manner. The arrangement of electrodes provided on the vibrating arms 2a and 2b are the same with each other except that the excitation electrodes 41 and 51 are in reverse relation to each other. An electrode pattern made of a derivation electrode 42 is formed on the surface of a base 1 so that these first excitation electrodes 41 are electrically connected to each other. An electrode pattern made of a derivation electrode 52 is formed on the surface of the base 1 so that the second excitation electrodes 51 are electrically connected.

Figure 2A:
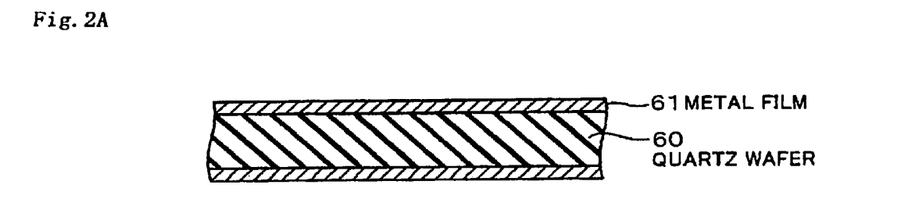
FIGS. 2A to 2E are schematic cross sectional views showing the method for manufacturing the tuning fork type quartz resonator relating to an embodiment of the present invention.
Figure 2B:
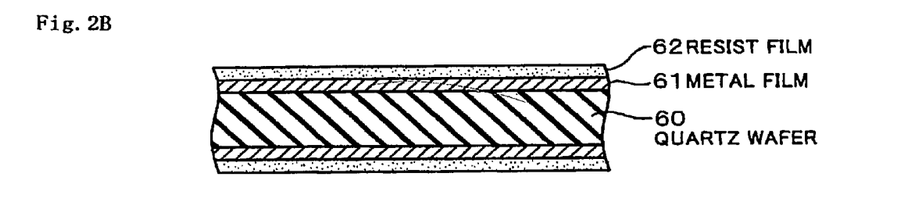

A method for manufacturing the quartz resonator shown in FIG. 1 will be explained next referring to FIG. 2A to FIG. 6S. It should be noted that FIG. 2A to FIG. 6S are views which explain one piece of the quartz resonator made at a certain portion of a sheet of the piezoelectric substrate. FIG. 2A to FIG. 4O are views of manufacturing processes for a cross sectional portion along C-C line in FIG. 1, and FIG. 5L to FIG. 6S are views of manufacturing processes for cross sectional portions along B-B line and C-C line in FIG. 1. First, after polishing and cleaning a quartz wafer 60 which is a cut out piezoelectric substrate, a metal film 61 is formed by a sputtering method (FIG. 2A). A film in which gold (Au) is stacked on a backing film of, for instance, chromium (Cr) is used as the metal film 61.

Figure 2C:
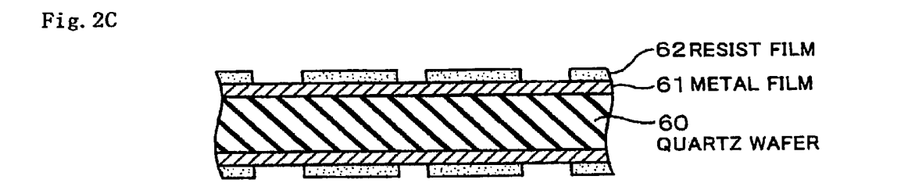
Figure 2D:
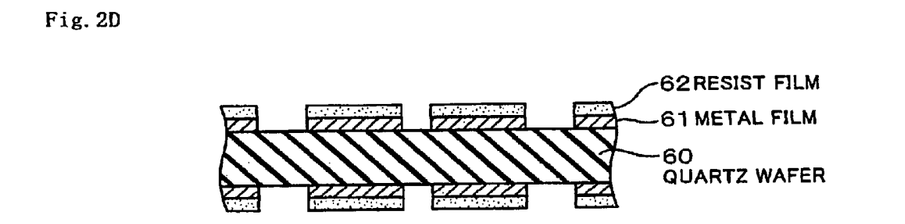

Then, after applying photoresist on such a metal film 61 by a spray method for instance (FIG. 2B), the photoresist is exposed and developed to form a resist mask 62 having the shape of a quartz piece, namely, a tuning fork shaped pattern (FIG. 2C). Thereafter, the quartz wafer 60 is immersed into a potassium iodide solution (KI) using the resist film 62 to perform wet etching. Thereby, a portion of the metal film 61 not covered by the resist film 62 is removed (FIG. 2D).

Figure 2E:
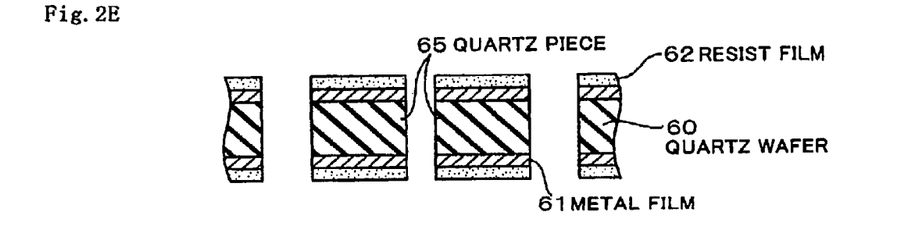

Thereafter, the quartz wafer 60 is immersed into hydrofluoric acid that is an etching solution to perform wet etching using the metal film 61 as a mask while the resist film 62 is kept staying on the metal film 61 so that the outside shape of the quartz piece 65 is formed (FIG. 2E). Thus, a plurality of quartz pieces 65 are formed on the quartz wafer 60 that is a piezoelectric substrate.

Figure 3F:
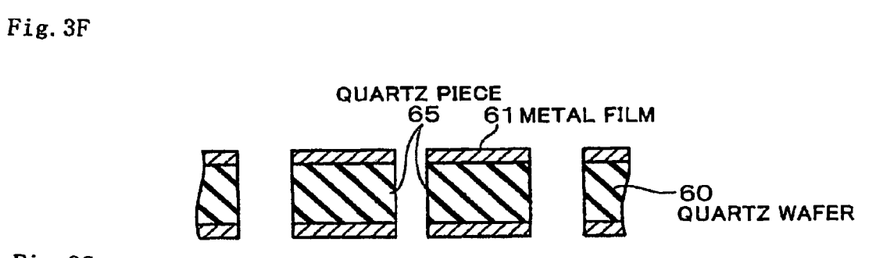
FIGS. 3F to 3H are schematic cross sectional views showing the method for manufacturing the tuning fork type quartz resonator relating to the embodiment of the present invention.
Figure 3G:
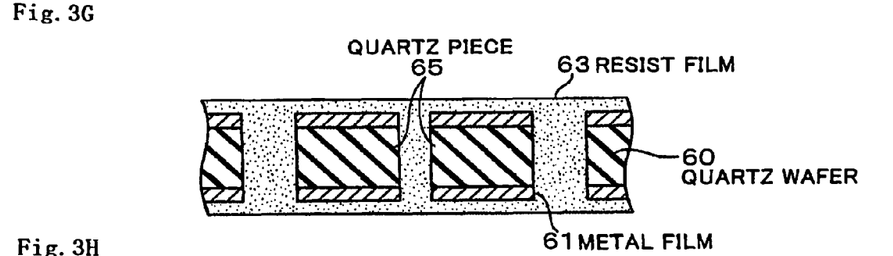

Then, all of the resist film 62 left on the quartz wafer 60 is removed (FIG. 3F). Thereafter, a photoresist is applied to the overall surface of the quartz wafer 60 by the spray method for instance, and the resist film 63 is formed thereon (FIG. 3G).

Figure 3H:
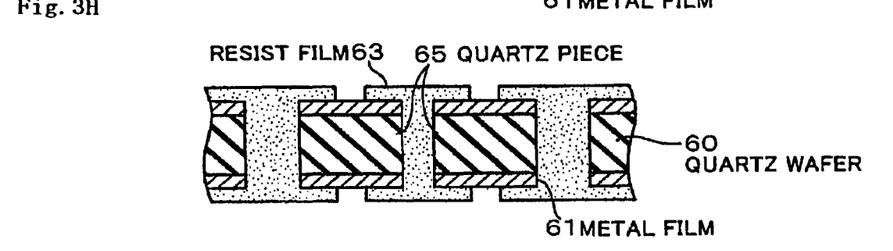
Figure 4I:
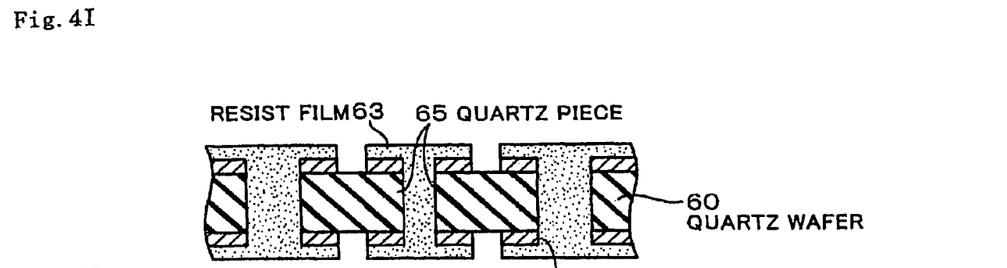
FIGS. 4I to 4K are schematic cross sectional views showing the method for manufacturing the tuning fork type quartz resonator relating to the embodiment of the present invention.

Next, the portion of the resist corresponding to the grooves 31 and 32 shown in FIG. 1 is removed by lithography (FIG. 3H). Then, using the above-described resist film 63 as a mask, wet etching is conducted by immersing the quartz wafer 60 into a potassium iodide (KI) solution to remove the metal film 61 at the portion where the resist film 63 is removed (FIG. 4I).

Figure 4J:
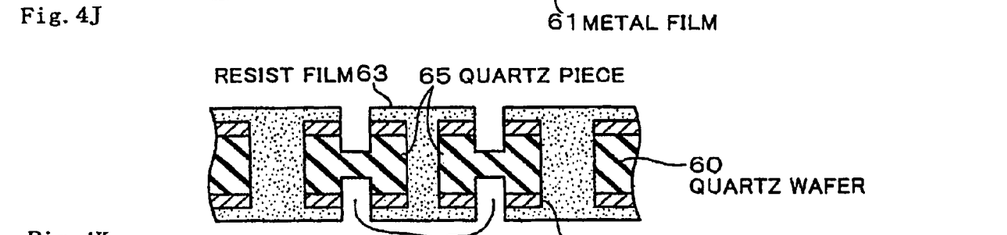
Figure 4K:
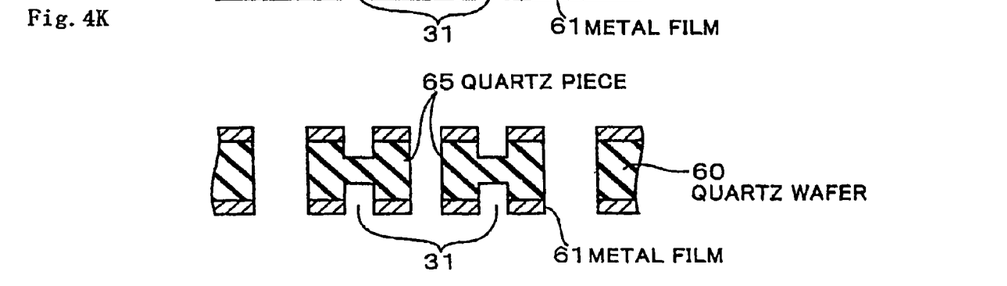
Figure 7:
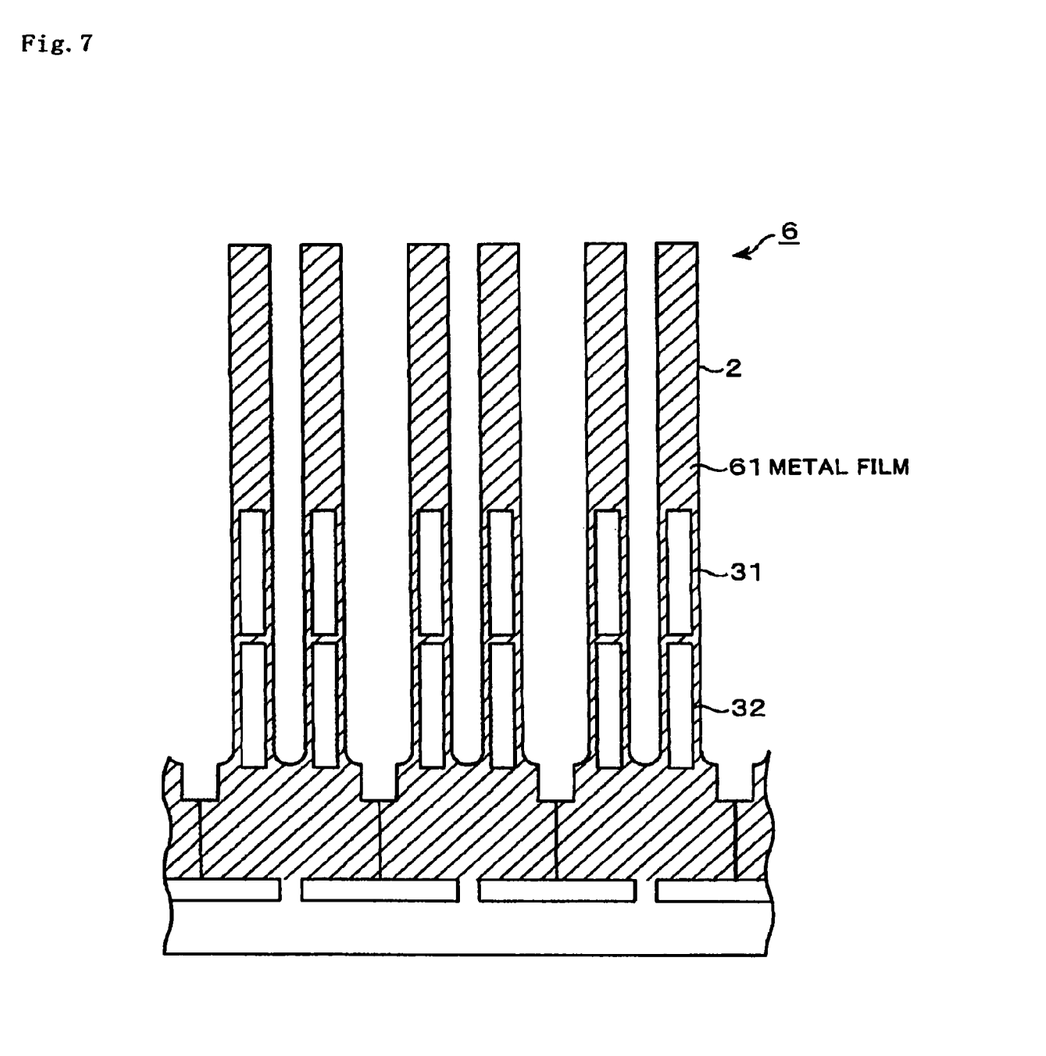
FIG. 7 is a plan view showing an example of an original of a quartz resonator manufactured in the manufacturing process of the tuning fork type quartz resonator relating to the embodiment of the present invention.

Thereafter, the quartz wafer 60 is immersed into hydrofluoric acid that is an etching solution to perform wet etching using the metal film 61 as a mask while the resist film 63 is kept staying on the metal film 61 so that the grooves 31 and 32 are formed on both main surfaces of the quartz wafer 60 (FIG. 4J). Then, all of the resist film 63 left on the quartz wafer 60 is removed (FIG. 4K). By the above described processes, an original 6 in which the metal film 61 is formed on the surface of the quartz wafer 60 as shown in FIG. 7 is manufactured. It should be noted that the slant line areas in FIG. 7 show the metal films 61, and are not showing a cross section of the original 6.

Figure 5L:
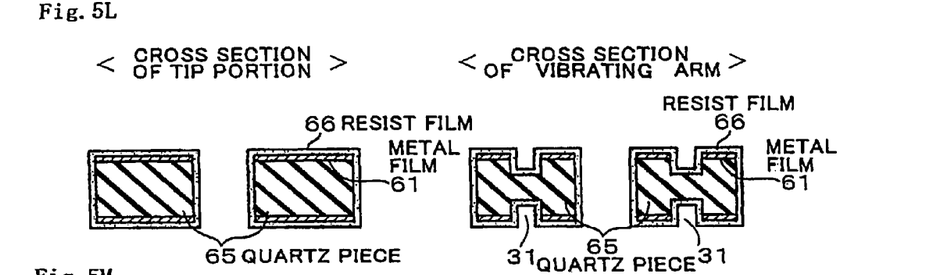
FIGS. 5L to 5P are schematic cross sectional views showing the method for manufacturing the tuning fork type quartz resonator relating to the embodiment of the present invention.
Figure 5M:
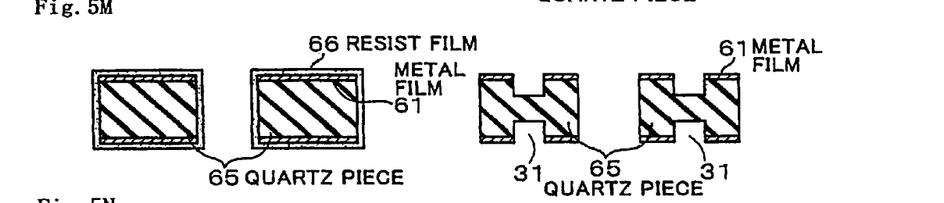
Figure 5N:
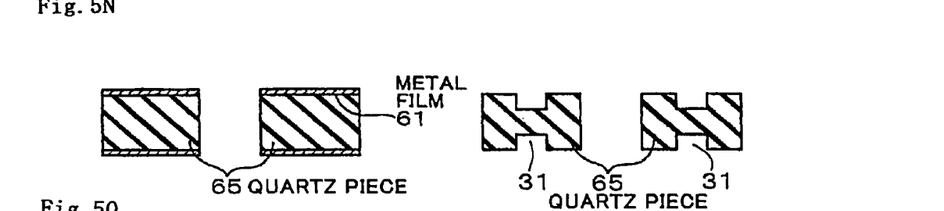

Next, a process of leaving a metal film on a formation area of the metal film for frequency adjustment in the tip portions of the above-described vibrating arms 2a and 2b will be explained. First, photoresist is applied to both surfaces of the original 6 by the spray method for instance, and a resist film 66 is formed (FIG. 5L). Then, the resist film 66 except the tip portions of the vibrating arms 2a and 2b shown in FIG. 1 is removed by photolithography (FIG. 5M). Then, wet etching is performed by immersing the original 6 into a potassium iodide (KI) solution to remove the metal film 61 at the portion where the resist film 66 is removed, and after that the resist film 66 left in the resist film 66 is removed. Thereafter, the resist film 66 left at the tip portion of the vibrating arms 2a and 2b is removed (FIG. 5N).

Figure 5O:
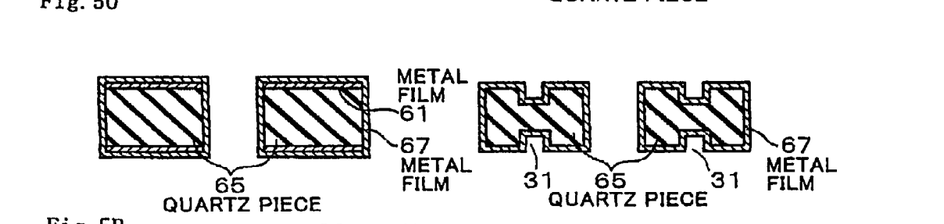
Figure 5P:
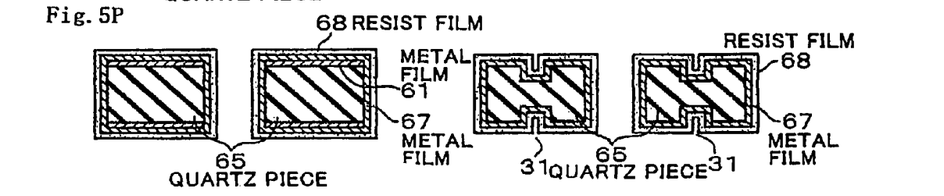

Then, the process to prepare an electrode pattern will be explained. After the process shown in FIG. 5N, a metal film 67 which will be an electrode on the both surfaces of the original 6 by the sputtering method is formed (FIG. 5O). A film in which gold (Au) is stacked on a backing film of, for instance, chromium (Cr) is used as the metal film 67.

Figure 6Q:
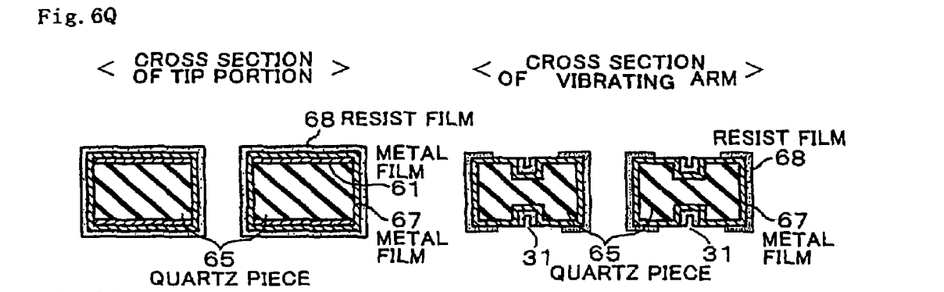
FIGS. 6Q to 6S are schematic cross sectional views showing the method for manufacturing the tuning fork type quartz resonator relating to the embodiment of the present invention.

After that, photoresist is applied to such a metal film 67 by the spray method (FIG. 5P) so that a resist mask 68 which will be an electrode pattern is formed by the photolithography. The mask 68 has an aperture at a portion except the area of adjusting weights 40 and 50 provided at the tip portions of the vibrating arms 2a and 2b as shown in FIG. 1 (FIG. 6Q). Accordingly, the resist film 68 is left in the areas of the adjusting weights 40 and 50.

Figure 6R:
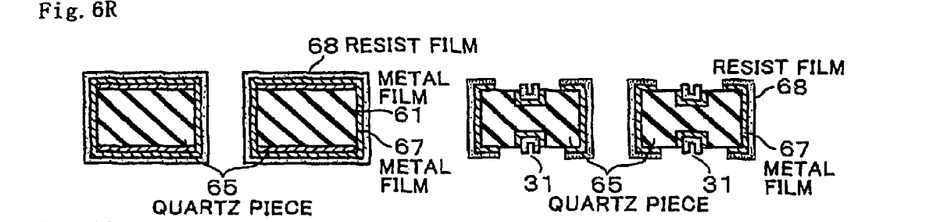
Figure 6S:
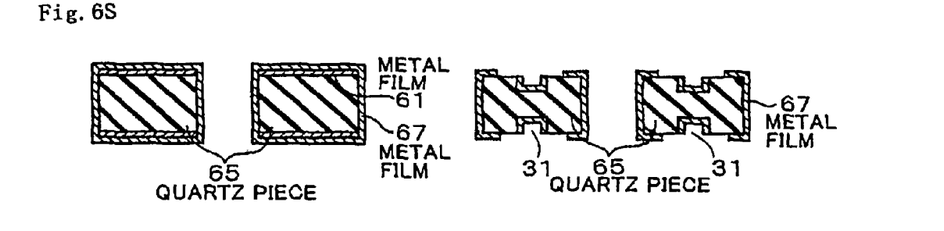

Next, an electric pattern is formed by etching the metal film 67 using the above-described resist mask 68 (FIG. 6R). Then, all of the resist film 68 left on the original 6 is removed (FIG. 6S). It should be noted that the thickness of the metal films 61 and 67 formed on the tip portions of the vibrating arms 2a and 2b is 0.4 μm and the thickness of the metal film 67 formed on the surfaces of other quartz wafers 60 is 0.1 μm.

Thereafter, at the tips in the vibrating arms 2a and 2b, adjustment of oscillation frequency is conducted by shaving the surface of the metal film 67 formed at the tip portion with a laser or the like to adjust the thickness thereof. Then, the quartz resonator shown in FIG. 1 is to be cut out form the original 6 on which the electrode pattern is formed.

According to the above-described embodiment, the metal film 61 which was used for forming the grooves 31 and 32 in the vibrating arms 2a and 2b is left at the tips of the vibrating arms 2a and 2b, and then, the metal film 67 to be an electrode is newly formed on the surface of the quartz wafer 60. Accordingly, the thickness of the metal film formed at the tips of the vibrating arms 2a and 2b becomes great. As a result, since the range of frequency adjustment can be wide, which makes it possible to suppress the reduction of the yields, and at the same time, to reduce the amount of metal for electrodes during the process shown in FIG. 5O. Therefore, the effect of saving metal is great especially when gold (Au) is used for metal because of expensiveness of gold.

In addition, in the above-described embodiment, after forming the shape of the quartz piece 65, the grooves 31 and 32 are formed on both main surfaces of the quartz wafer 60, it is also possible to form the shape of the quartz piece 65 after forming the grooves 31 and 32 on both main surfaces of the quartz wafer 60. To be more specific, firstly, the metal film 61 is removed with a resist mask having apertures at the portion corresponding to the grooves 31 and 32 shown in FIG. 1 so that the surfaces of the quartz wafer 60 are exposed, and the grooves 31 and 32 are formed on both main surfaces of the quartz wafer 60 by removing the exposed portions. Then, the metal film 61 is removed to expose the surface of the quartz wafer 60 by using a resist mask having a pattern corresponding to the outside shape portion of the quartz piece 65, and covering the grooves 31 and 32, and the outside shape of the quartz piece 65 is formed by removing the exposed portion.

Figure 8A:
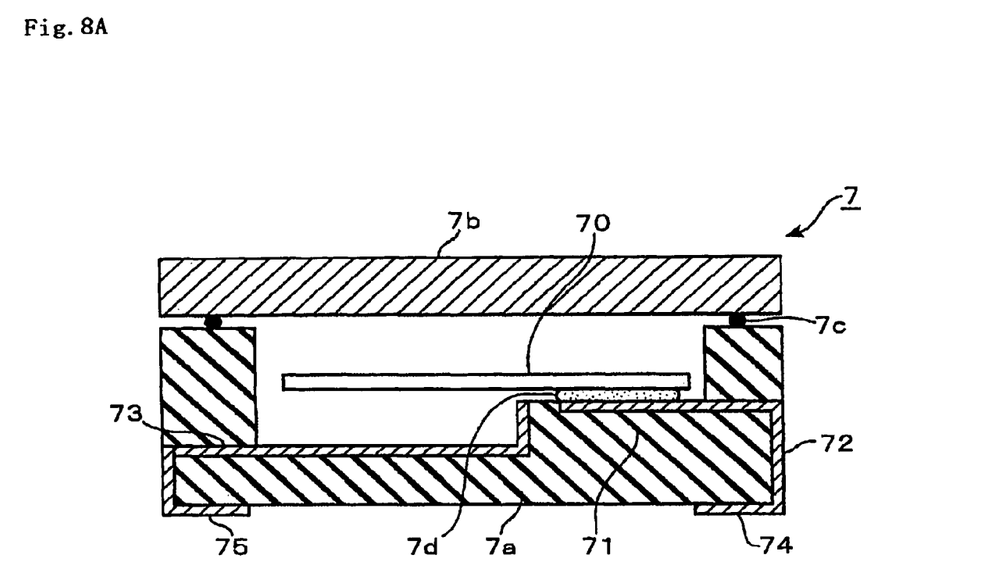
FIGS. 8A and 8B are a schematic vertical cross sectional view and a back view showing an example of quartz resonator packages which houses the tuning fork type quartz resonator relating to an embodiment of the present invention.
Figure 8B:
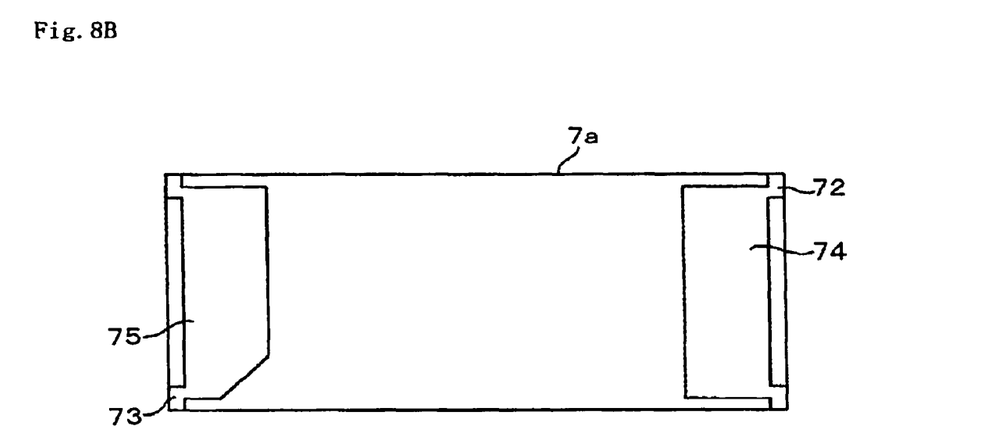

In addition, the above-described quartz resonator is housed in a package 7 made of Surface Mounted Device (SMD) structure ceramics as shown in, for instance, FIGS. 8A and 8B. The package 7 is composed of a case 7a made of, for instance, ceramics, of which the upper surface has an aperture, and a lid 7b made of, for instance, metal. The case 7a and the lid 7b are seam welded via a sealant 7c made from, for instance, a welding material, and the inside thereof is in a vacuum state. In the inside of the above-described package 7, the base 1 of the quartz resonator 70 is fixed to a pedestal 71 via a conductive adhesive 7d. The posture of the quartz resonator 70 in the above-described package 7 is horizontal as such that the vibrating arms 2a and 2b are extending into a space on the inside of the package 7. On the surface of the pedestal 71, conductive paths 72 and 73 (73 is a conductive path arranged at right angle to the drawing) are placed, and the derivation electrodes 42 and 52 formed on the base 1 are connected to the conductive paths 72 and 73 via the conductive adhesive 7d. The above-described conductive paths 72 and 73 are connected respectively to electrodes 74 and 75 arranged in a manner to oppose to the longitudinal direction of the outside bottom surface of the case 7a. As a result, the above-described quartz resonator 70 is forced to oscillate when a voltage is applied to the derivation electrodes 42 and 52 of the base 1 via the electrodes 74, 75, the conductive paths 72, 73, and the conductive adhesive 7d. Thus, a package type quartz resonator is structured. The quartz resonator is installed on a wiring substrate (not shown) on which the circuit part of an oscillation circuit is installed, and thereby electric parts are structured.

Embodiment

In a case of manufacturing a quartz resonator of 32 kHz, the change of frequency caused by shaving all of the surfaces of the metal films 61 and 67, which are formed at the tips of the vibrating arms 2a and 2b of the quartz resonator of the present invention manufactured by the processes shown in FIG. 2A to FIG. 6S is found to be about 15,000 ppm. The film thickness of the metal films 61 and 67 is 0.4 μm. This is the embodiment.

The change of frequency caused by shaving all of the surfaces of the metal film 14, which is formed at the tips of the vibrating arms 2a and 2b of a conventional quartz resonator manufactured by the processes shown in FIG. 10A to FIG. 12N is found to be about 4,000 ppm. The film thickness of the metal film 14 is 0.1 μm. This is taken as a comparison example.

Therefore, while the amount of frequency adjustment in the comparison example is 4,000 ppm, that in the embodiment is about four times greater of 15,000 ppm. This makes it possible to improve the yields to, for instance, 100%.

What is claimed is:

1. A method for manufacturing a plurality of piezoelectric oscillating pieces including a base, a plurality of vibrating arms extending from the base, and grooves formed in these respective vibrating arms by etching a piezoelectric substrate, comprising the steps of:

obtaining a piezoelectric oscillating piece which has an outside shape portion and grooves and wherein a front side and a rear side of said piece excepting said grooves are covered with a first metal film;

forming a frequency adjustment region at a tip portion of said piezoelectric oscillating piece by forming a resist mask on the surface of said piezoelectric substrate that covers the first metal film at said tip portion and leaves exposed the first metal film at portions other than the tip portion, then removing the exposed other first metal film portions;

forming an electrode by forming a second metal film on the whole surface of the outside shape portion of the piezoelectric oscillating piece, including on the first metal film remaining at the tip portion;

forming a new resist mask on the surface of said second metal film to etch the second metal film so as to form an electrode pattern including said tip portion;

removing said new resist mask; and adjusting the oscillation frequency of the piezoelectric oscillating piece by shaving at least the second metal film of said first and second metal films at the tip portion frequency adjustment region so as to adjust a thickness thereof.

2. The method for manufacturing the piezoelectric resonator according to claim 1, wherein, before said adjusting the oscillation frequency by shaving, a combined thickness of the first and second metal films at the tip portion is 0.3 to 0.5 µm, and the thickness of the second metal film defining the electrode pattern is 0.1 to 0.2 µm.

3. A method for manufacturing a plurality of piezoelectric oscillating pieces including a base, a plurality of vibrating arms extending from the base, and grooves formed in these respective vibrating arms by etching a piezoelectric substrate, comprising the steps of:

forming a first metal film on both surfaces of said piezoelectric substrate;

forming a first resist mask having a pattern corresponding to the outside shape portion of the piezoelectric oscillating piece on said first metal film and etching said first metal film to expose the surface of the piezoelectric substrate;

then, etching the exposed portion of the piezoelectric substrate and thus manufacturing the outside shape portion of the piezoelectric oscillating piece;

removing said first resist mask and forming a second resist mask having an aperture at a portion corresponding to said groove;

etching said first metal film using the second resist mask to expose the surface of the piezoelectric substrate;

then, etching the exposed portion of the piezoelectric substrate and thus forming the groove;

removing said second resist mask and forming a third resist mask on the surface of said piezoelectric substrate so that the tip of said vibrating arm which will be a formation area of a second metal film for frequency adjustment is covered and other portions are exposed and removing said other portions of the first metal film which are exposed;

removing said third resist mask and forming the second metal film for forming an electrode on the surface of the outside shape portion of the piezoelectric oscillating piece;

forming a fourth resist mask on the surface of said second metal film and etching the second metal film, thereby forming an electrode pattern; and removing said fourth resist mask and adjusting the oscillation frequency by shaving at least the second metal film of said first and second metal films for frequency adjustment formed at the tip of the said vibrating arm so as to adjust the thickness thereof.

4. The method for manufacturing the piezoelectric resonator according to claim 3, wherein, before said adjusting the oscillation frequency by shaving, a combined thickness of the first and second metal films formed at the tip of said vibrating arm is 0.3 to 0.5 µm, and the thickness of the second metal film defining the electrode pattern is 0.1 to 0.2 µm.

5. A method for manufacturing a plurality of piezoelectric oscillating pieces including a base, a plurality of vibrating arms extending from the base, and grooves formed in these respective vibrating arms by etching a piezoelectric substrate, comprising the steps of:

forming a first metal film on both surfaces of said piezoelectric substrate;

forming a first resist mask having an aperture at a portion corresponding to said groove in said piezoelectric oscillating piece on said first metal film and etching said first metal film to expose the surface of the piezoelectric substrate;

then, etching the exposed portion of the piezoelectric substrate and thus forming the groove;

removing said first resist mask and forming a second resist mask having a pattern corresponding to the outside shape portion of the piezoelectric oscillating piece;

etching said first metal film using the second resist mask to expose the surface of the piezoelectric substrate;

then, etching the exposed portion of the piezoelectric substrate and thus manufacturing the outside shape portion of the piezoelectric oscillating piece;

removing said second resist mask and forming a third resist mask on the surface of said piezoelectric substrate so that the tip of said vibrating arm which will be a formation area of a second metal film for frequency adjustment is covered and other portions are exposed and removing the other portions of the first metal film which are exposed;

removing said third resist mask and forming the second metal film for forming an electrode on the surface of the outside shape portion of the piezoelectric oscillating piece;

forming a fourth resist mask on the surface of said second metal film and etching the second metal film, thereby forming an electrode pattern; and removing said fourth resist mask and adjusting the oscillation frequency by shaving at least the second metal film of said first and second metal films for frequency adjustment formed at the tip of the said vibrating arm so as to adjust the thickness thereof.

6. The method for manufacturing the piezoelectric resonator according to claim 5, wherein, before said adjusting the oscillation frequency by shaving, a combined thickness of the first and second metal films formed at the tip of said vibrating arm is 0.3 to 0.5 µm, and the thickness of the second metal film defining the electrode pattern is 0.1 to 0.2 µm.

* * * * *